US006838952B2

(12) United States Patent
Ramet

(10) Patent No.: US 6,838,952 B2
(45) Date of Patent: Jan. 4, 2005

(54) AMPLITUDE CONTROL DEVICE FOR ELECTRICAL OSCILLATOR AND ELECTRICAL OSCILLATOR COMPRISING SUCH A DEVICE

(75) Inventor: Serge Ramet, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/446,173

(22) Filed: May 27, 2003

(65) Prior Publication Data

US 2004/0008091 A1 Jan. 15, 2004

(30) Foreign Application Priority Data

May 24, 2002 (FR) .......................................... 02 06348

(51) Int. Cl.[7] .......................... H03B 5/04; H03B 5/12; H03L 5/00

(52) U.S. Cl. .................... 331/183; 331/109; 331/117 R

(58) Field of Search ............................ 331/109, 117 R, 331/117 FE, 117 D, 182, 183, 185, 186

(56) References Cited

U.S. PATENT DOCUMENTS 4,999,588 A 3/1991 Koch ........................ 331/109

FOREIGN PATENT DOCUMENTS

DE 2909814 A1 * 9/1980

OTHER PUBLICATIONS

Margarit et al., A Low–Noise, Low–Power VCO with Automatic Amplitude Control for Wireless Applications, IEEE Journal of Solid–State Circuits, IEEE Inc., New York, US, vol. 34, No. 6, Jun. 1999, pp. 761–771, XP000913030.

Zanchi et al., Automatic Amplitude Control Loop for a 2–V, 2.5 GHz LC–Tank VCO, Proceedings of the IEEE 2001 Custom Integrated Circuits Conference, San Diego, CA, May 6–9, 2001, IEEE Custom Integrated Circuits Conference, New York, NY, vol. CONF. 23, May 6, 2001, pp. 209–212, XP010546881.

Zanchi et al., A 2–V 2.5 GHz—104—dBc/Hz at 100 kHz Fully Integrated VCO with Wide–Band Low–Noise Automatic Amplitude Control Loop, IEEE Journal of Solid–State Circuits, vol. 36, No. 4, Apr. 4, 2001, pp. 611–619, XP002231063.

* cited by examiner

*Primary Examiner*—David Mis

(74) *Attorney, Agent, or Firm*—Allen, Dyer, Doppelt, Milbrath & Gilchrist, P.A.; Lisa K. Jorgenson

(57) ABSTRACT

An amplitude control device for a signal output by an oscillator includes a rectification circuit for rectifying the output signal, and a differential amplification circuit for generating a biasing current control signal for the oscillator. The biasing current control signal is based upon the output signal from the rectification circuit and a reference voltage. A dividing bridge and an adder are designed so that only a fraction of the reference voltage is used to define the amplitude of the oscillations. The contribution made to the oscillator phase noise by the reference voltage noise is considerably reduced.

8 Claims, 5 Drawing Sheets

AMPLITUDE CONTROL DEVICE FOR ELECTRICAL OSCILLATOR AND ELECTRICAL OSCILLATOR COMPRISING SUCH A DEVICE

FIELD OF THE INVENTION

The present invention relates to an amplitude control device for an electrical oscillator, and an electrical oscillator comprising such a device.

The present invention is applicable to radio communication systems, and more particularly, to mobile telephone systems, such as GSM, DCS, PCS, UMTS, etc.

BACKGROUND OF THE INVENTION

An electrical oscillator is a circuit that produces an electrical signal at a frequency defined by a time constant specific to it. FIG. 1 illustrates a principle diagram for an electrical oscillator that includes an inductance L, a capacitor C and a holding amplifier A. The oscillator time constant is equal to $\sqrt{LC}$ and the oscillation frequency is equal to $\frac{1}{2\pi}\sqrt{LC}$.

The amplitude of voltage oscillations measured at the terminals of the LC circuit is determined by non-linearities of the holding amplifier. It is important to check the amplitude of the voltage oscillations to achieve correct interfacing between the oscillator and the oscillator load circuits that receive the oscillation voltage on their inputs.

If the oscillator is integrated on silicon, manufacturing parameter dispersions affect the value of the amplitude of oscillations. For example, this is the case for the resistivity of metals for which the dispersions (+/−10%) modify the quality coefficient of the inductances and the capacitors, or the resistivity of poly-crystalline silicon for which the dispersions (+/−20%) modify the oscillator biasing current.

One known way of reducing these dispersions is to make amplitude slaving circuits that apply a retroaction on the oscillator biasing current. For example, this type of slaving circuit is described in the article titled "A 2V 2.5 GHz-104 dB/Hz At 100 kHz Fully Integrated VCO Wideband Low Noise Automatic Amplitude Control" (Alfio Zanchi et al, IEEE JSSC, VOL 36, No. 4, pp. 611–619, April 2001), and in the article titled "A Low Noise Low Power VCO With Automatic Amplitude Control For Wireless Application" (M. A. Margarit et al., IEEE JSSC, VOL 34, No. 6, pp. 761–771, June 1999).

An example of an oscillator with its slaving circuit according to known art is shown in FIG. 2. The circuit in FIG. 2 comprises an oscillator 1, a rectification stage 2 and a differential amplifier 3. The oscillator 1 comprises two transistors Q1, Q2, two resistances R1, R2, two inductances L1, L2, three capacitors C1, C2 and C3, and a current generator G. Three biasing voltages VBB, VCC, VEE power the oscillator 1. The output voltage from the oscillator 1 is taken from the terminals of capacitor C1.

The rectification stage 2 receives the output voltage from the oscillator on its input and detects the peak level of the oscillation voltage, for example, by double alternation rectification. The output voltage from the rectification stage is applied to a first input to the differential amplifier 3. A reference voltage Vref is applied to the second input of the differential amplifier 3. The output signal from the differential amplifier 3 controls the amplitude of the biasing current that passes through the current generator G. Thus, the amplitude of the output voltage from the oscillator 1 is controlled by the level of the reference voltage Vref.

This type of circuit has the disadvantage that it copies all the noise of the reference voltage Vref for frequencies within the slaving passband, and that there is no noise control outside this passband. This copying affects the phase noise in addition to the amplitude noise. Ideally, amplitude regulation should only generate an amplitude modulation. However, the non-linear nature and parametric effects of the oscillator cause the amplitude noise to be converted to phase noise, thus deteriorating the spectral quality of the oscillation signal.

SUMMARY OF THE INVENTION

The invention relates to an amplitude control device for a signal output by an oscillator. The amplitude control device comprises slaving means comprising rectification means to rectify the signal output by the oscillator, and differential amplification means to form a control signal for the oscillator biasing current starting from the signal taken at the output from the rectification means and a reference voltage.

The slaving means further includes a divider bridge to form a first fraction of the reference voltage and a second fraction of the reference voltage starting from the reference voltage. The first fraction of the reference voltage is applied to a first input of the differential amplification means. An adder adds the signal output by the rectification means and the second fraction of the reference voltage. The signal output by the adder is applied to a second input to the differential amplification means.

Advantageously, the invention considerably reduces the contribution of the reference voltage noise to the oscillator phase noise. Only a fraction of the reference voltage is used to define the amplitude of the oscillations. Consequently, for frequencies less than the amplitude slaving passband, the noise injected into the oscillator is proportional to the product of this fraction by the reference voltage noise.

According to one improvement to the invention, the device controlling the amplitude of the signal output by an oscillator comprises additional slaving means to control the oscillator noise level for frequencies greater than frequencies within the passband of the slaving means.

The invention also relates to an electrical oscillator characterized in that it comprises a signal amplitude control device according to the invention.

BRIEF DESCRIPTION OF THE DRAWINGS

Other characteristics and advantages of the invention will become clear after reading a preferred embodiment of the invention with reference to the attached figures among which.

DETAILED DESCRIPTION OF THE PREFERRED EMBODIMENTS

Figure 1:
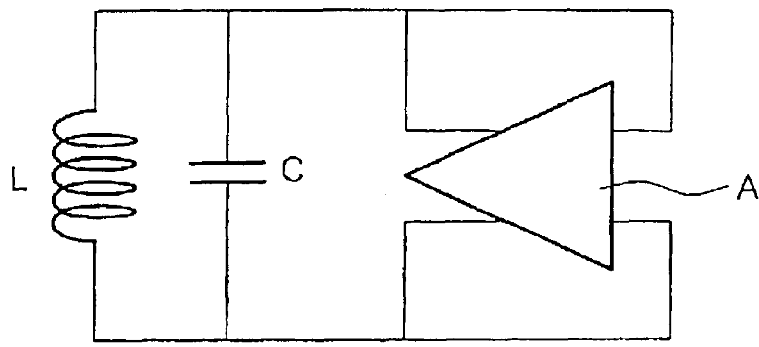
FIG. 1 is a schematic diagram of an electrical oscillator according to the prior art.
Figure 2:
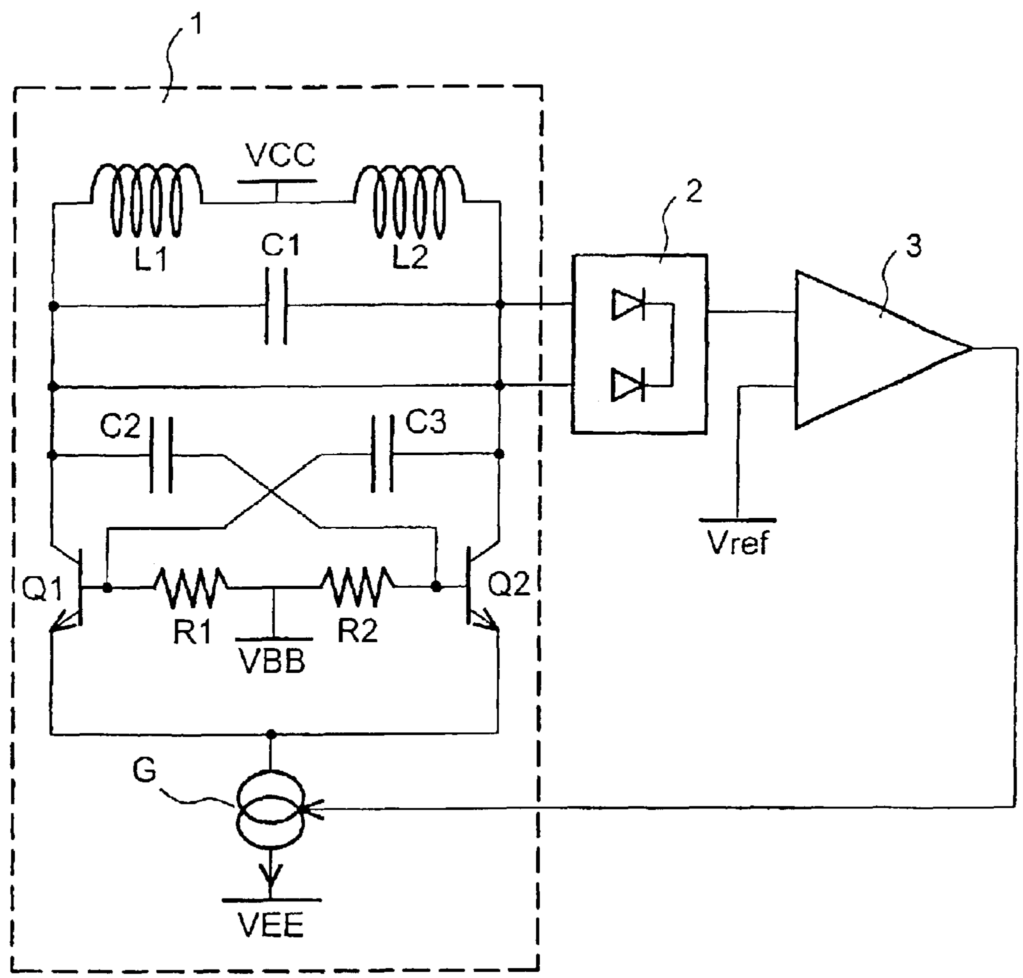
FIG. 2 is a schematic diagram of an electrical oscillator with an oscillation amplitude slaving circuit according to the prior art.
Figure 3:
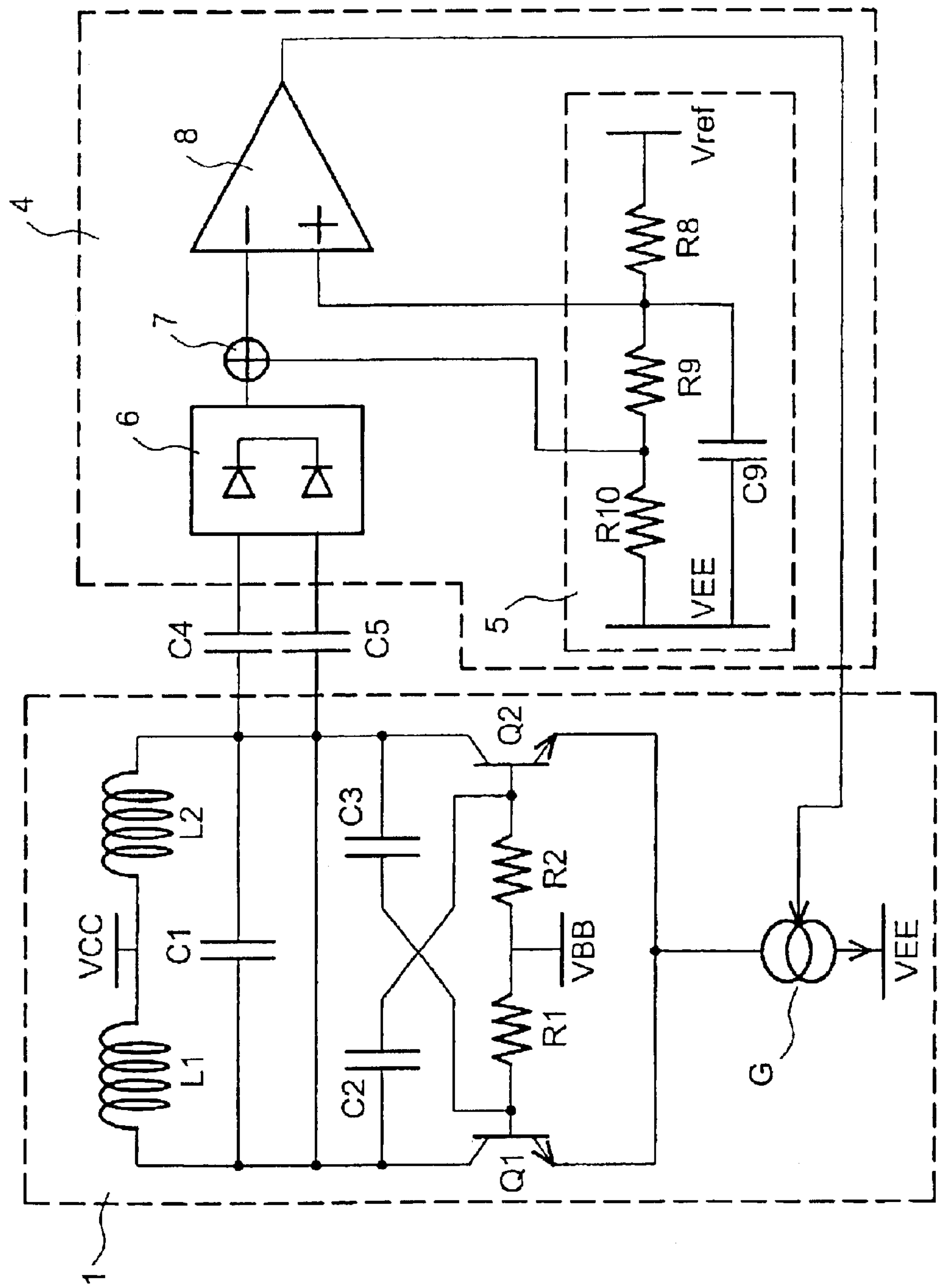
FIG. 3 is a schematic diagram of an electrical oscillator with an oscillation amplitude slaving circuit according to the present invention.

The same references denote the same elements on all figures. FIGS. 1 and 2 have already been described, therefore these figures will not be described again. FIG. 3 shows an electrical oscillator with an amplitude slaving circuit according to the invention. The circuit in FIG. 3 comprises an oscillator 1 and an amplitude slaving circuit 4. The oscillator 1 is identical to the oscillator shown in FIG. 2. The amplitude slaving circuit 4 comprises a voltage divider bridge 5, a rectification stage 6, an adder 7 and a differential amplifier 8.

The input terminals to the amplitude slaving circuit 4 are the input terminals to the rectification stage 6. The amplitude slaving circuit 4 output is the output from the differential amplifier 8. A first capacitor C4 is between the first output terminal of the oscillator 1 and a first input terminal to the rectification stage 6. Similarly, a second capacitor C5 is between a second output terminal of the oscillator 1 and a second output terminal from oscillator 1.

The voltage divider bridge 5 comprises three resistances R8, R9, R10 mounted in series and a decoupling capacitor C9 is mounted in parallel with resistances R9 and R10. The reference voltage Vref is applied to a first terminal of the resistance R8, the second terminal of which is connected to a first input (+) of the differential amplifier 8 and to the first terminal of the resistance R9 The second terminal of the resistance R9 is connected to a first input of adder 7 and to a first terminal of resistance R10. The second terminal of resistance R10 is connected to a power supply voltage VEE.

The output from the rectification stage 6 is connected to a second input of an adder 7, the output of which is connected to the second input (−) of the differential amplifier 8. The output signal from the differential amplifier 8 forms the amplitude control signal for biasing the current that passes through the current generator G.

Figure 4:
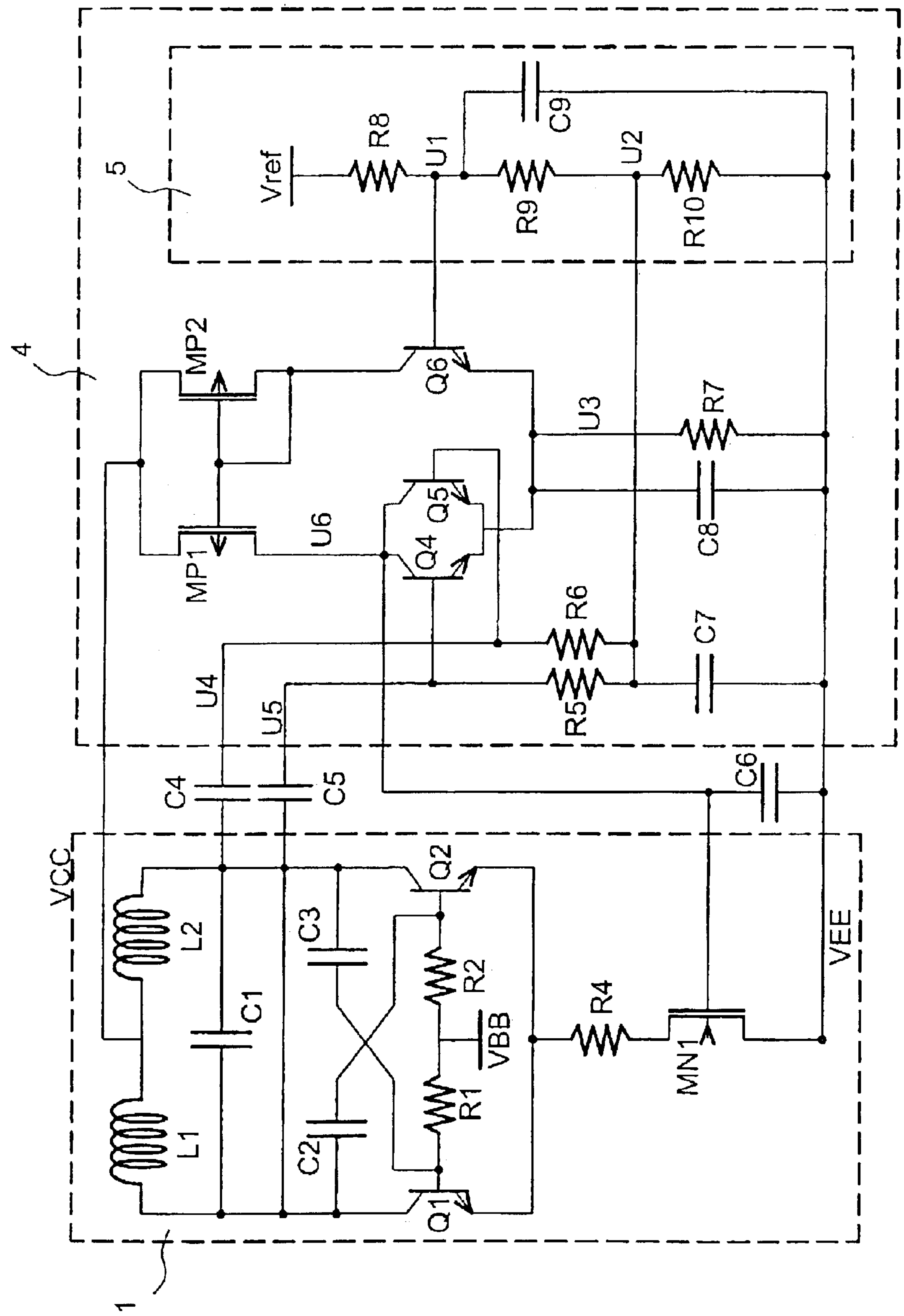
FIG. 4 is a more detailed schematic diagram of the electrical oscillator shown in FIG. 3.

FIG. 4 illustrates an example electrical oscillator like that shown in FIG. 3. Apart from the divider bridge 5, the amplitude slaving circuit 4 comprises two P-type MOS (Metal Oxide Semiconductor) transistors MP1 and MP2, three bipolar transistors Q4, Q5 and Q6, two decoupling capacitors C7, C8 and three resistances R5, R6 and R7. The transistors Q4 and Q5 perform the rectification. The differential amplifier 8 is composed of transistors MP1, MP2, Q4, Q5, Q6 and the resistance R7. The participation of transistors Q4 and Q5 in the rectification and differential amplification functions has the advantage of limiting the number of stages in the amplitude slaving circuit 4, and consequently, obtaining better noise performances of this circuit.

Transistors Q4 and Q5 are mounted on a common emitter. The common emitter of transistors Q4 and Q5 is connected to a first terminal of the resistance R7, the second terminal of which is connected to a power supply voltage VEE. The decoupling capacitor C8 is parallel with the resistance R7.

The bases of transistors Q4 and Q5 form the inputs to the rectification circuit 6 and are connected to a first terminal of the resistance R5, and to a first terminal of resistance R6. The second terminals of the resistances R5 and R6 are both connected to a first terminal of capacitor C7. The second terminal of the capacitor C7 is connected to the power supply voltage VEE.

The collectors of transistors Q4 and Q5 are connected to each other and form the output from the differential amplifier. The collectors of Q4 and Q5 are connected to the source of the transistor MP1, and the drain of this transistor is connected to the biasing voltage VCC. The collector of transistor Q6 is connected to the source of transistor MP2, the drain of which is connected to the biasing voltage VCC. The gates of transistors MP1 and MP2 are connected to each other and to the source of transistor MP2. The emitter of transistor Q6 is connected to the emitters of transistors Q4 and Q5. The base of transistor Q6 is connected to the second terminal of resistance R8. The second terminal of resistance R9 is connected to the second terminals of resistances R5 and R6.

The current generator G includes a resistance R4 in series with a N-type MOS transistor MN1. The source terminal of the transistor MN1 is connected to the DC voltage VEE. The output voltage from the slaving circuit, which is picked up on the collector common to transistors Q4 and Q5, is applied to the gate of transistor MN1. A capacitor C6 is between the grid of transistor MN1 and the voltage VEE.

In the remainder of the description, the voltages U1, U2, U3, U4, U5 and U6 represent the following potential differences: the potential difference taken between the node common to resistances R8 and R9 and the circuit ground; the potential difference taken between the node common to resistances R9 and R10 and the circuit ground; the potential difference taken between the emitters common to transistors Q4, Q5 and Q6 and the circuit ground; the potential difference taken between the first input to the slaving circuit 4 and the circuit ground; the potential difference taken between the second input to the slaving circuit 4 and the circuit ground; and the potential difference taken between the output from the slaving circuit 4 and the circuit ground.

When the oscillator has not yet started, the voltages U4 and U5 are equal to U2 and the differential amplifier composed of Q4, Q5, Q6, R7, MP1 and MP2 is unbalanced since the voltage U1 is greater than U4 and U5. Consequently, the voltage U6 is close to VCC. The transistor MN1 then has a minimum resistance Ron (MN1) which creates a maximum biasing current for the oscillator so that oscillations can start.

The amplitude of the oscillations then increases gradually, thus superposing two alternating voltages with opposite phases onto the DC component of the voltages U4 and U5 such that when a positive half-alternation of the voltage U4 takes place, and transistor Q5 is blocked, transistor Q4 outputs current Ie(Q4) such that:

$$Ie(Q4) = Is \cdot e \cdot \frac{U4 - U3}{P}$$

where P is the thermodynamic potential.

The situation is reversed during a positive half-alternation of U5. The currents that pass through the emitters of transistors Q4 and Q5 are summed and filtered by the capacitor C8, and the voltage U3 is an image of the average value of these currents. When this average value of the current is equal to the DC current output by the transistor Q6, the following is true:

$$< Ie(Q4) > = \frac{2}{T}\int_0^{\frac{T}{2}} Is \cdot e \frac{U4 - U3}{P} dt,$$

$$Ie(Q6) = Is \cdot e \frac{U1 - U3}{P},$$

where p is the thermodynamic potential, <Ie(Q4)> is the average value of the current Ie(Q4), and T is the period of the oscillation signal.

$$U4+U2+Um\cdot\sin\left(2\cdot\pi\cdot\frac{t}{T}\right),$$

where Um is the amplitude of the signal present on one of the oscillator output nodes. If the filtering done by the capacitor C8 is sufficiently efficient, it can be assumed that the voltage U3 is constant and we then have:

$$\frac{2}{T}\int_0^{\frac{T}{2}} Is\cdot e^{\frac{U2+Um\cdot\sin\left(\frac{2\cdot\pi\cdot t}{T}\right)}{P}}dt = Is\cdot e\cdot\frac{U1}{P}$$

$$\text{namely: }\frac{2}{T}\int_0^{\frac{T}{2}} e^{\frac{Um\cdot\sin\left(\frac{2\cdot\pi\cdot t}{T}\right)}{P}}dt = e^{\frac{U1-U2}{P}}$$

if we make a variable substitution $$x=\frac{2\cdot\pi\cdot t}{T},\text{ we obtain: }\ln\left[\int_0^{\pi} e^{\frac{Um\cdot\sin(x)}{P}}dx\right]=\frac{U1-U2}{P} \quad [3]$$

Equation 3 shows that the amplitude Um only depends on the difference (U1–U2) that is a fraction of the reference voltage Vref. We have:

$$\left(U1-U2=\frac{R9}{R8+R9+R10}\ VREF\right)$$

Thus, the noise of the reference voltage Vref injected into the slaving is also multiplied by only this fraction of the reference voltage, which reduces its contribution to the oscillator phase noise.

It may be noted that the circuit according to the invention can be used to adapt the noise quantity injected by the reference voltage to the amplitude of the oscillations. Equation [3] shows that a reduction in the reference voltage Vref causes a reduction in the quantity U1–U2, and consequently a reduction in the amplitude Um of the oscillations. The oscillators thus made are only slightly sensitive to the reference voltage noise.

However, for frequencies greater than the frequencies of the passband of the slaving circuit 4, there is some phase noise that returns from the oscillator. This noise return phenomenon is particularly visible if the transistor MN1 is operating in its saturated zone. It is then necessary to guarantee that MN1 operates in its pure resistance zone. This condition is satisfied by the use of an additional slaving circuit.

Figure 5:
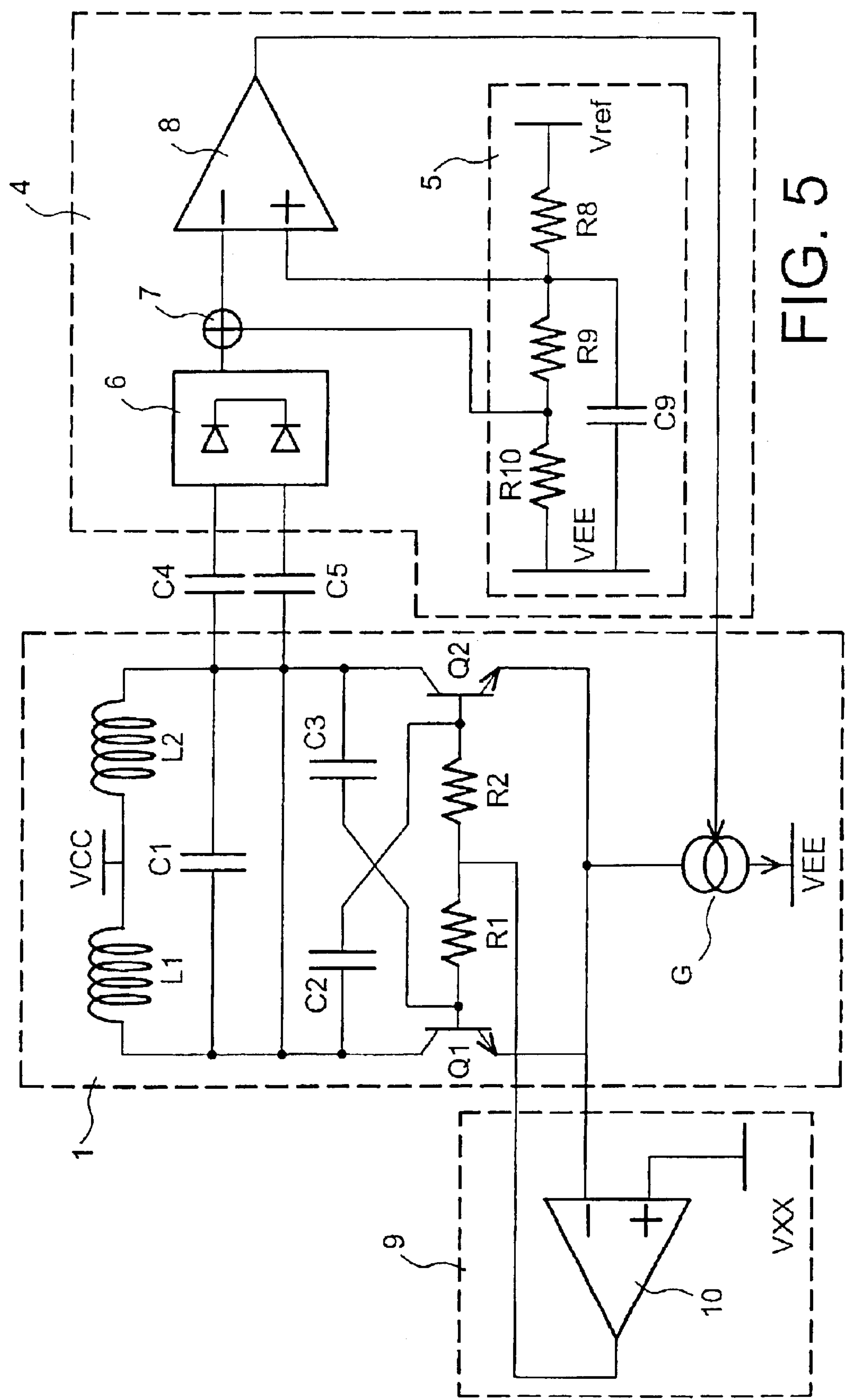
FIG. 5 is a schematic diagram of an electrical oscillator with an improvement to the circuit shown in FIG. 3.
Figure 6:
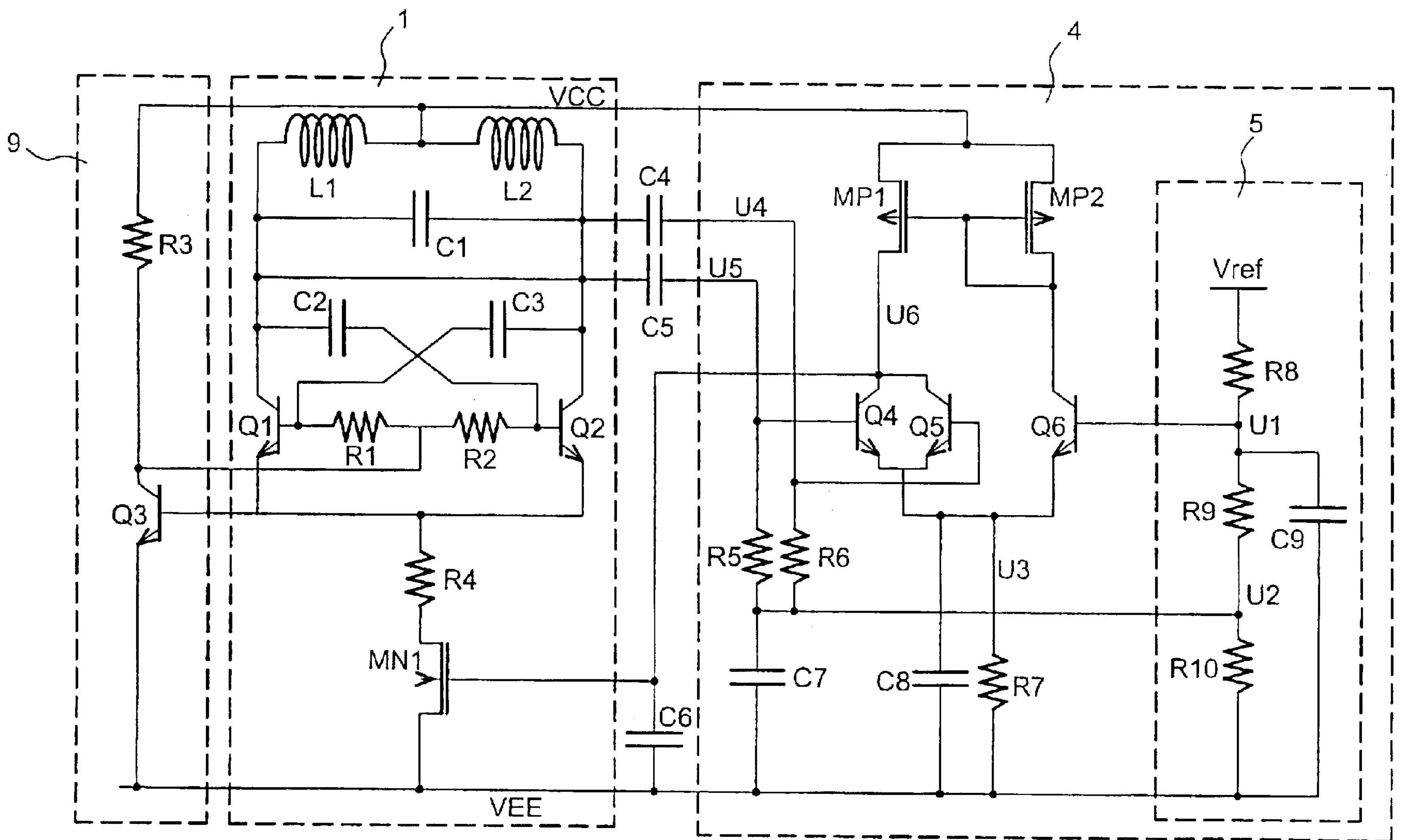
FIG. 6 is a more detailed schematic diagram of the electrical oscillator shown in FIG. 5.

FIG. 5 shows a slaving device comprising such an additional slaving circuit. FIG. 6 shows an example embodiment of the slaving device shown in FIG. 5. With reference to FIG. 5, the additional slaving circuit 9 controls the oscillator noise level for frequencies greater than the frequencies within the passband of the slaving circuit 4.

The additional slaving circuit 9 is composed of a differential amplifier, a first input of which is connected to the emitters of transistors Q1 and Q2, and a second input of which is connected to a DC voltage VXX. The output of the differential amplifier is connected to the terminal common to resistances R1 and R2 of the oscillator 1, which is therefore no longer connected to a DC voltage VBB as is the case according to the prior art.

According to the example shown in FIG. 6, the circuit 9 comprises a resistance R3 and a transistor Q3. The first input, the second input and the output from the differential amplifier respectively correspond to the base, the emitter and the collector of transistor Q3. The emitter of transistor Q3 is connected to the power supply voltage VEE (and then VXX=VEE), and the collector of transistor Q3 is connected to a first terminal of the resistance R3, the second terminal of which is connected to the power supply voltage VCC. The resistance R3 fixes the biasing current of the second slaving. The resistance R4 of the current generator is chosen such that the transistor MN1 operates in its pure resistance zone. The following relation must then be satisfied:

Vbe(Q3)–R4.Iosc>Vdss(MN1), where

Vbe(Q3), Iosc and Vdss(MN1) respectively represent the voltage on the base of transistor Q3, the oscillator biasing current, and the drain/source saturation voltage of transistor MN1.

It may also be noted that the additional slaving circuit contributes to reducing the phase noise of R1, R2, Q1 and Q2 for frequencies less than its passband. This statement is particularly relevant if a CMOS type technology is used (HCMOS9 type), if transistors Q1 and Q2 are replaced by NMOS transistors, and if Q3 is a native NPN transistor based on this technology. Under these conditions, the contribution of low frequency noise from NMOS transistors to the oscillator phase noise is almost entirely canceled.

This invention is applicable to oscillators in general, and particularly to voltage controlled oscillators (VCO).

That which is claimed is:

1. An amplitude control device for an output signal from an oscillator, the amplitude control device comprising slaving means comprising:

rectification means for rectifying the output signal;

differential amplification means connected to said rectification means for providing a control signal for controlling an oscillator biasing current;

a voltage divider bridge comprising first, second and third resistances connected together in series between a first voltage reference and a second voltage reference, said voltage divider bridge for dividing the first voltage reference into first and second voltage fractions, the first voltage fraction being taken between said first and second resistances, and the second voltage fraction being taken between said second and third resistances;

an adder for adding the rectified output signal and the second voltage fraction, and providing a summed signal to a second input of said differential amplification means, said adder comprising a fourth resistance having a first terminal connected to said rectification means, and a second terminal connected to said voltage divider bridge for receiving the second voltage fraction; and a fifth resistance having a first terminal connected to said rectification means, and a second terminal connected to said voltage divider bridge for receiving the second voltage fraction;

said rectification means comprising a first bipolar transistor comprising a base connected to the first terminal of said fourth resistance, a collector, and an emitter; and a second bipolar transistor comprising a base connected to the first terminal of said fifth resistance, a collector connected to the collector of said first bipolar transistor, and an emitter connected to the emitter of said first bipolar transistor; and said differential amplification means comprising a first P-type MOS transistor comprising a gate, a source connected to the collectors of said first and second bipolar transistors which forms an output of said differential amplification means, and a drain connected to a biasing voltage, a second P-type MOS transistor comprising a gate connected to the gate of said first P-type MOS transistor, a source connected to the gate of said first P-type MOS transistor, and a drain connected to the drain of said first P-type MOS transistor, a third bipolar transistor comprising a base connected to said voltage divider bridge for receiving the first voltage fraction, a collector connected to the source of said second P-type MOS transistor, and an emitter connected to the emitters of said first and second bipolar transistors, and a sixth resistance having a first terminal connected to the emitters of said first, second and third bipolar transistors, and a second terminal connected to the second voltage reference.

2. An amplitude control device according to claim 1, further comprising:

a first decoupling capacitor having a first terminal connected to the second terminals of said fourth and fifth resistances; and a second decoupling capacitor having a first terminal connected to the emitters of said first, second and third bipolar transistors, and a second terminal connected to the second voltage reference.

3. An amplitude control device according to claim 1, further comprising additional slaving means connected to the oscillator for controlling an oscillator noise level for frequencies greater than frequencies within a passband of said slaving means.

4. An amplitude control device according to claim 1, wherein the oscillator is connected to said differential amplification means for receiving the control signal, the oscillator comprising a current generator for providing the oscillator biasing current, the current generator comprising a resistance, and a transistor connected in series to the resistance, the resistance having a value so that the transistor operates in a resistance zone.

5. A circuit comprising:

an oscillator for providing an output signal; and an amplitude control device connected to said oscillator for controlling an amplitude of the output signal, said amplitude control device comprising rectification means for rectifying the output signal, differential amplification means connected to said rectification means for providing a control signal for controlling an oscillator biasing current, a voltage divider bridge comprising first, second and third resistances connected together in series between a first voltage reference and a second voltage reference, said voltage divider bridge for dividing the first voltage reference into first and second voltage fractions, the first voltage fraction being taken between said first and second resistances, and the second voltage fraction being taken between said second and third resistances, an adder for adding the rectified output signal and the second voltage fraction, and providing a summed signal to a second input of said differential amplification means, said adder comprising a fourth resistance having a first terminal connected to said rectification means, and a second terminal connected to said voltage divider bridge for receiving the second voltage fraction; and a fifth resistance having a first terminal connected to said rectification means, and a second terminal connected to said voltage divider bridge for receiving the second voltage fraction, said rectification means comprising a first bipolar transistor comprising a base connected to the first terminal of said fourth resistance, a collector, and an emitter; and a second bipolar transistor comprising a base connected to the first terminal of said fifth resistance, a collector connected to the collector of said first bipolar transistor, and an emitter connected to the emitter of said first bipolar transistor, and said differential amplification means comprising a first P-type MOS transistor comprising a gate, a source connected to the collectors of said first and second bipolar transistors which forms an output of said differential amplification means, and a drain connected to a biasing voltage, a second P-type MOS transistor comprising a gate connected to the gate of said first P-type MOS transistor, a source connected to the gate of said first P-type MOS transistor, and a drain connected to the drain of said first P-type MOS transistor, a third bipolar transistor comprising a base connected to said voltage divider bridge for receiving the first voltage fraction, a collector connected to the source of said second P-type MOS transistor, and an emitter connected to the emitters of said first and second bipolar transistors, and a sixth resistance having a first terminal connected to the emitters of said first, second and third bipolar transistors, and a second terminal connected to the second voltage reference.

6. A circuit according to claim 5, wherein said amplitude control device further comprises:

a first decoupling capacitor having a first terminal connected to the second terminals of said fourth and fifth resistances; and a second decoupling capacitor having a first terminal connected to the emitters of said first, second and third bipolar transistors, and a second terminal connected to the second voltage reference.

7. A circuit according to claim 5, further comprising a slaving circuit connected to said oscillator for controlling an oscillator noise level for frequencies greater than frequencies within a passband of said amplitude control device.

8. A circuit according to claim 5, wherein said oscillator is connected to said differential amplifier for receiving the control signal, said oscillator comprising a current generator for providing the oscillator biasing current, said current generator comprising a resistance, and a transistor connected in series to said resistance, the resistance having a value so that said transistor operates in a resistance zone.

* * * * *

UNITED STATES PATENT AND TRADEMARK OFFICE

CERTIFICATE OF CORRECTION

PATENT NO. : 6,838,952 B2
DATED : January 4, 2005
INVENTOR(S) : Ramet

It is certified that error appears in the above-identified patent and that said Letters Patent is hereby corrected as shown below:

Column 4,
Lines 59-64, delete "

$$<Ie(Q4)> = \frac{2}{T}\int_0^{\frac{T}{2}} Is.e\,\frac{U4-U3}{P}\,dt,$$

$$Ie(Q6) = Is.e\,\frac{U1-U3}{P},"$$

insert

-- $$<Ie(Q4)> = \frac{2}{T}\int_0^{\frac{T}{2}} Is \cdot e\,\frac{U4-U3}{P}\,dt,$$ --

$$Ie(Q6) = Is \cdot e\,\frac{U1-U3}{P}, \text{ and}$$

$$Ie(Q6) = <Ie(Q4)>$$

Column 5,
Line 1, insert -- Also: --

Signed and Sealed this

Tenth Day of May, 2005

JON W. DUDAS
*Director of the United States Patent and Trademark Office*